United States Patent
Ma

(10) Patent No.: US 8,153,507 B2
(45) Date of Patent: Apr. 10, 2012

(54) METHOD OF MANUFACTURING HIGH POWER ARRAY TYPE SEMICONDUCTOR LASER DEVICE

(75) Inventor: Byung Jin Ma, Suwon (KR)

(73) Assignee: Samsung LED Co., Ltd., Gyunggi-do (KR)

(*) Notice: Subject to any disclaimer, the term of this patent is extended or adjusted under 35 U.S.C. 154(b) by 519 days.

(21) Appl. No.: 11/677,677

(22) Filed: Feb. 22, 2007

(65) Prior Publication Data

US 2007/0196951 A1    Aug. 23, 2007

(30) Foreign Application Priority Data

Feb. 22, 2006   (KR) .................. 10-2006-0017420

(51) Int. Cl.
*H01L 21/30* (2006.01)

(52) U.S. Cl. ........ 438/458; 438/110; 438/113; 438/455; 438/456; 438/460; 438/670; 438/675; 438/702; 438/725; 438/761

(58) Field of Classification Search .......... 438/670, 438/675, 700, 702, 703, 725, 761, 778, 942, 438/951, FOR. 132, FOR. 455, 106, 110, 438/113, 455, 456, 458, 460
See application file for complete search history.

(56) References Cited

U.S. PATENT DOCUMENTS

| | | | |
|---|---|---|---|
| 5,234,153 A | | 8/1993 | Bacon et al. |
| 5,776,794 A | * | 7/1998 | McCann .................. 438/46 |
| 6,240,116 B1 | * | 5/2001 | Lang et al. ............. 372/50.12 |
| 6,396,857 B1 | * | 5/2002 | Labranche et al. .......... 372/36 |
| 6,621,839 B1 | * | 9/2003 | Schroeder et al. ............. 372/36 |
| 6,636,538 B1 | * | 10/2003 | Stephens ..................... 372/36 |
| 2004/0165628 A1 | * | 8/2004 | Rice .......................... 372/36 |
| 2005/0164420 A1 | * | 7/2005 | Kuniyasu et al. ............ 438/47 |
| 2007/0246829 A1 | | 10/2007 | Yamane et al. | |

FOREIGN PATENT DOCUMENTS

| | | |
|---|---|---|
| JP | 01-259587 | 10/1989 |
| JP | 02-069987 | 3/1990 |
| JP | 04-186688 | 7/1992 |
| JP | 05-152683 | 6/1993 |

(Continued)

OTHER PUBLICATIONS

Japanese Office Action, w/ English translation thereof, issued in Japanese Patent Application No. JP 2007-042723 dated Apr. 27, 2010.

Japanese Office Action, w/ English translation thereof, issued in Japanese Patent Application No. JP 2007-042723 dated Feb. 1, 2011.

(Continued)

*Primary Examiner* — Wael Fahmy
*Assistant Examiner* — Joannie A Garcia
(74) *Attorney, Agent, or Firm* — McDermott Will & Emery LLP

(57) ABSTRACT

A method of manufacturing an array type semiconductor laser device. The method includes forming first and second electrodes on lower and upper surfaces of a wafer comprising a plurality of semiconductor laser arrays having a plurality of laser emission regions, and forming a metal bonding layer on the second electrode of the wafer. The method also includes dicing the wafer into the semiconductor laser arrays and mounting each of the individually separated semiconductor laser arrays on a base with the surface of the metal bonding layer in contact with the base. The method further includes melting the metal bonding layer to fix the mounted semiconductor laser array on the base.

8 Claims, 4 Drawing Sheets

FOREIGN PATENT DOCUMENTS

| | | |
|---|---|---|
| JP | 05-226771 | 9/1993 |
| JP | 09-312358 | 12/1997 |
| JP | 11-284098 | 10/1999 |
| JP | 2003-344719 | 12/2003 |
| JP | 2004-327982 | 11/2004 |
| JP | 2005-136072 | 5/2005 |

OTHER PUBLICATIONS

Japanese Decision to Decline Amendment and Decision of Rejection, w/ English translation thereof, issued in Japanese Patent Application No. 2007-042723, dated Oct. 4, 2011.

* cited by examiner

METHOD OF MANUFACTURING HIGH POWER ARRAY TYPE SEMICONDUCTOR LASER DEVICE

CLAIM OF PRIORITY

This application claims the benefit of Korean Patent Application No. 2006-0017420 filed on Feb. 22, 2005, in the Korean Intellectual Property Office, the disclosure of which is incorporated herein by reference.

BACKGROUND OF THE INVENTION

1. Field of the Invention

The present invention relates to a high power semiconductor laser device and, more particularly, to a method of manufacturing a semiconductor laser device which includes an efficiently improved metal bonding process of a high power semiconductor laser array.

2. Description of the Related Art

Recently, high power semiconductor laser devices are extensively used in various applications such as industrial and medical fields including optical communication, optical recording devices, welding and dicing, and are also beginning to be applied to visible ray lasers for display, and thus expected to have further expanded applications.

In general, it is impossible to manufacture a laser apparatus of more than tens of watts with a single semiconductor laser device. Thus, in order to obtain a high power laser, an array type semiconductor laser device is used with several laser diodes arranged in the form of a bar.

In order to obtain light output of tens of watts, high current exceeding tens of amperes is applied, causing a considerable amount of heat in the laser array itself. If the heat is not appropriately discharged, the light output is degraded and the lifetime of the chip is shortened.

To overcome such problematic conditions, the array type laser device in general is provided in a package in which a laser array (or a laser bar) 10 is mounted on a base 21 of high heat conductivity using a metal bonding layer 29 such as solder.

In order to manufacture the conventional array type semiconductor laser device 20 into a package as shown in FIG. 1b, the bar-shaped laser array 10 is mounted on an upper surface of the base 21 with the metal bonding layer 29 deposited thereon as shown in FIG. 1a.

The laser array 10 includes a semiconductor laser stack structure 10' formed on a conductive substrate 11 and first and second electrodes 17 and 18 formed on upper and lower surfaces thereof. The laser array 10 requires a heat-treating process after the first and second electrodes 17 and 18 are formed, and thus has the metal bonding layer 29, which tends to be relatively easily melted at high temperature, formed on an upper surface of the base 21.

However, the base is usually manufactured for each unit package, and thus requires an individual deposition process of the metal bonding layer, which adversely affects the efficiency of the manufacturing process and a yield.

Further, as shown in FIG. 1b, when the laser array is heat-pressed on an upper surface of the base with the metal bonding layer provided thereon, the metal bonding material being melted for bonding may spread along the surface of the semiconductor laser array as denoted by the reference sign S, potentially causing short circuit of the laser.

SUMMARY OF THE INVENTION

The present invention has been made to solve the foregoing problems of the prior art and therefore an aspect of the present invention is to provide a method of manufacturing an array type semiconductor laser device which efficiently improves a metal bonding process of a semiconductor laser array to a base, thereby preventing short circuit due to metal bonding material melted during the bonding process.

According to an aspect of the invention, the invention provides a method of manufacturing a high power array type semiconductor laser device. The method includes:

forming first and second electrodes on lower and upper surfaces of a wafer comprising a plurality of semiconductor laser arrays having a plurality of laser emission regions;

forming a metal bonding layer on the second electrode of the wafer;

dicing the wafer into the semiconductor laser arrays;

mounting each of the individually separated semiconductor laser arrays on a base with the surface of the metal bonding layer in contact with the base; and melting the metal bonding layer to fix the mounted semiconductor laser array on the base.

According to the present invention, the step of forming the first and second electrodes includes: depositing the first and second electrodes on lower and upper surfaces of the wafer, respectively; and heat-treating the deposited first and second electrodes.

Preferably, the second electrode is closer to an active region of the laser than the first electrode so as to facilitate heat radiation through the base. In a specific embodiment of the present invention, the second electrode can be the p-electrode.

According to an embodiment of the present invention, the step of forming a metal bonding layer includes:

forming a photoresist pattern having open regions formed apart from the edges of the upper surface of the second electrode;

depositing a metal bonding layer in the photoresist pattern; and removing the photoresist pattern by a lift-off process to form a metal bonding layer apart from the edges of the upper surface of the second electrode.

More preferably, the photoresist pattern can be formed with a plurality of the open regions spaced apart in a predetermined interval.

The metal bonding layer can be made of one selected from the group consisting of In, Pb, Sn, Au, Ag and alloys thereof. In addition, preferably, the base may be a ceramic substrate of AlN or SiC or a metal substrate of Cu or CuW with excellent heat conductivity so as to be utilized as an effective heat sink.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 1A:
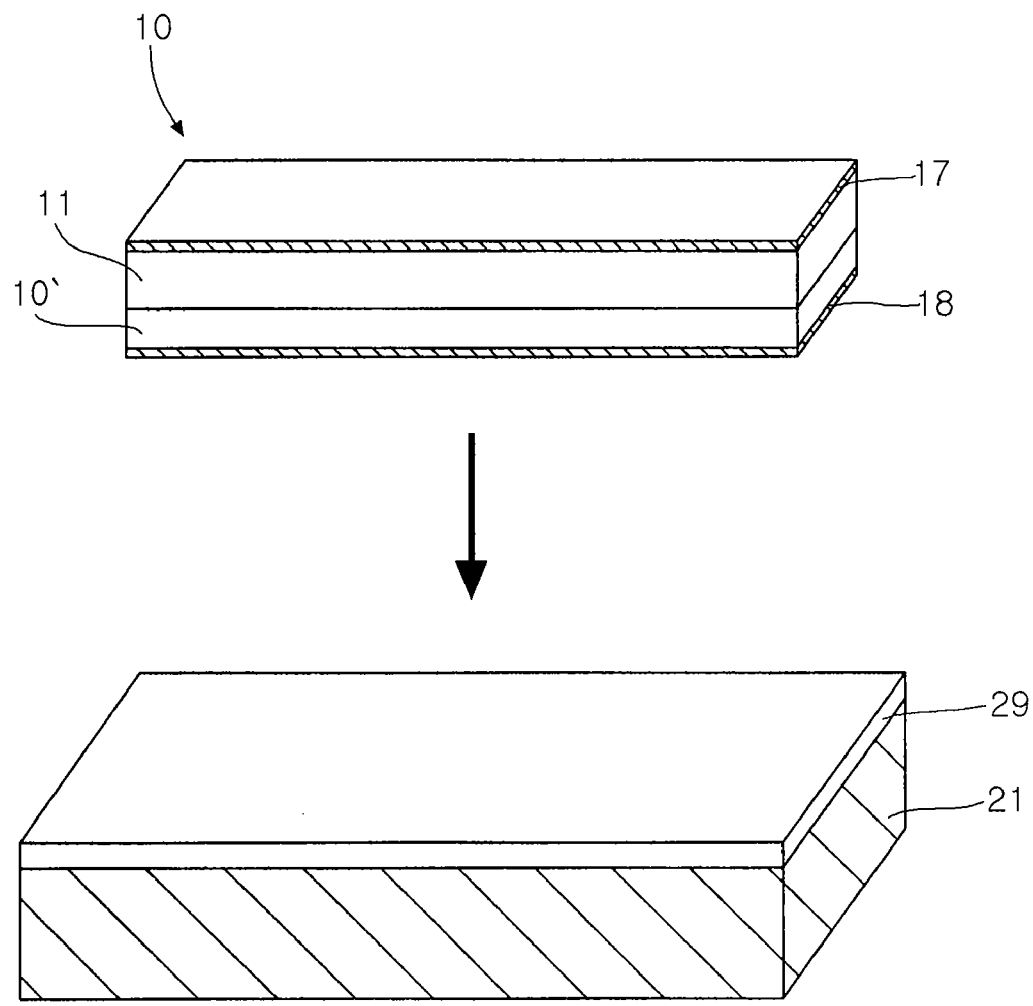
FIGS. 1a and 1b are perspective views illustrating a conventional manufacturing process of an array type semiconductor laser device.
Figure 1B:
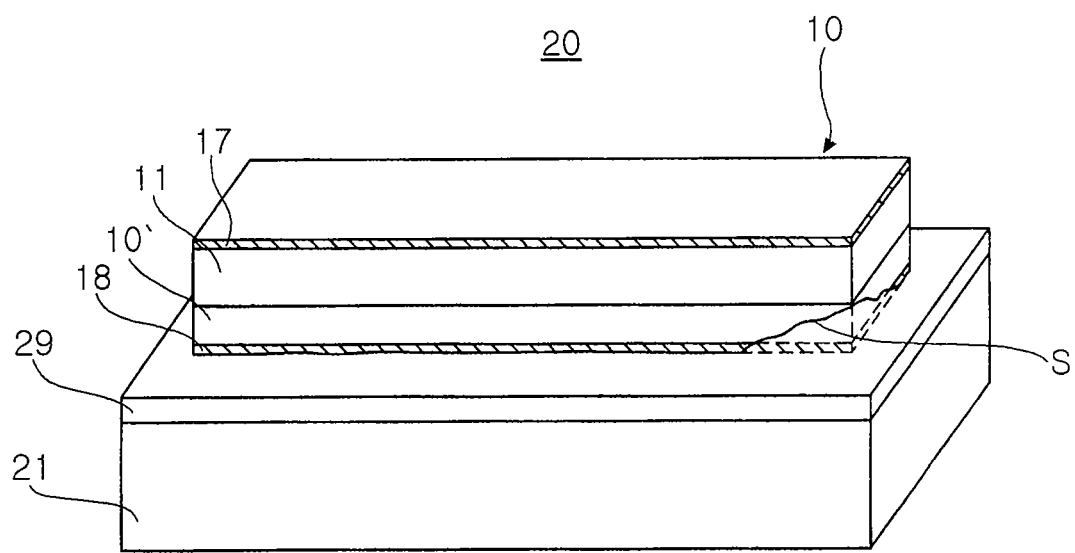
Figure 2:
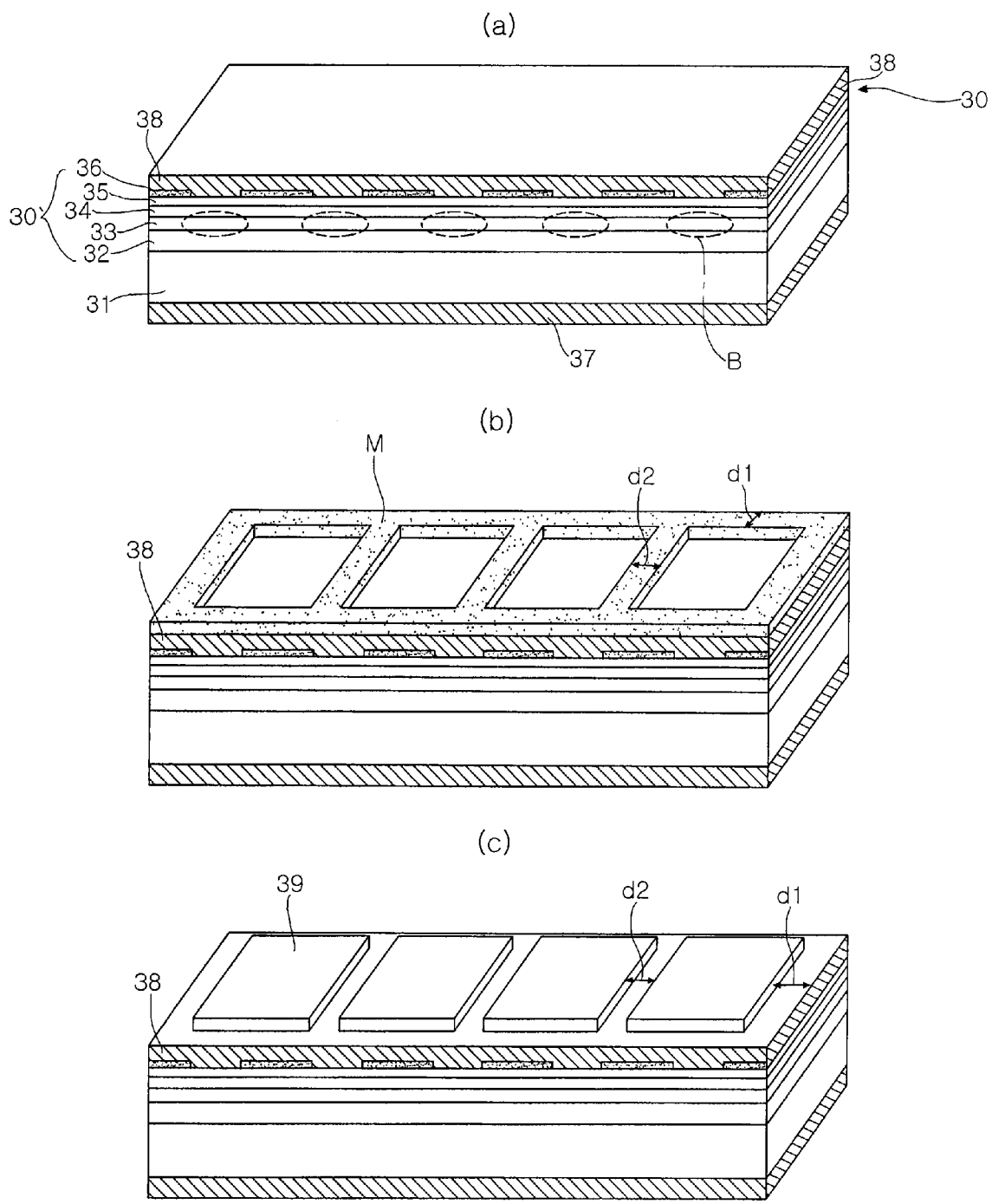
FIG. 2(a) to 2(c) are perspective views illustrating the procedures of fabricating a semiconductor laser array in the process of manufacturing an array type semiconductor laser device according to the present invention.

FIG. 2(a) to 2(c) are perspective views illustrating the procedures of fabricating a semiconductor laser array in a method of manufacturing an array type semiconductor laser device according to an embodiment of the present invention.

For the sake of convenience, the drawing exemplifies only one semiconductor laser array, but in actuality, the method is conducted at wafer level, and the semiconductor laser array should be understood as a wafer composed of a plurality of semiconductor laser arrays similar to the one shown in the drawing.

First, as shown in FIG. 2a, the semiconductor laser array 30 is fabricated. The method of fabricating the semiconductor laser array 30 can entail forming a first conductivity clad layer 32, an active layer 33, a second conductivity clad layer 34 and a second conductivity contact layer 35 on a first conductivity semiconductor substrate 31 and selectively depositing a current blocking layer 36, which is an insulation material, to define beam emitting regions B where beams are generated. Then, a first electrode 37 is formed on a lower surface of the semiconductor substrate 31 and a second electrode 38 is formed on the second conductivity contact layer 35 with the insulation layer 36 formed thereon. The electrodes can be formed by a typical deposition process and a heat-treating process. Before forming the first electrode 37, there may be adopted a lapping process to decrease the thickness of the substrate to 100 to 300 nm. As described above, the semiconductor laser array 30 shown in FIG. 2a can be understood as a wafer composed of a plurality of semiconductor laser arrays similar to the one shown in FIG. 2a.

Next, a metal bonding layer 39 (FIG. 2(c)) is formed on an upper surface of the second electrode 38 of the semiconductor laser array 30. The procedure for forming the metal bonding layer adopted in the present invention can be more effectively implemented at wafer level together with a series of semiconductor processes of for example growing an epitaxial layer and forming the electrodes for the laser. In particular, a photoresist process is readily carried out to enhance the accuracy of the process while improving a yield. In addition, selective formation of the metal bonding layer allows effective prevention of short circuit due to the metal bonding material melted in the metal bonding process.

Now, a process of forming the metal bonding layer according to an embodiment of the present invention will be explained with reference to FIGS. 2(b) and 2(c).

As shown in FIG. 2(b), a photoresist pattern M is formed on an upper surface of the second electrode 38 of the semiconductor laser array 30. It is preferable that the photoresist pattern M is formed such that open regions are spaced apart at a predetermined interval d1 from the edges of the wafer (the photoresist pattern can be formed in a width of d1×2), and that a plurality of open regions are spaced apart from each other in a predetermined interval d2. Such intervals d1 and d2 are provided to ensure a buffer region for preventing the melted metal bonding material from being pushed up and spread when the laser array is compressed on the base in a subsequent metal bonding process. Such a photoresist process can be effectively implemented together with a series of wafer-level semiconductor processes for forming the laser array 30 as mentioned above. In addition, the photoresist process is implemented after a lapping procedure for decreasing the thickness of the wafer. Optionally, the lapping procedure is implemented on the wafer while the wafer is fixed on a separate support substrate such as a glass substrate. However, if a high power laser is designed in such a fashion that an appropriate thickness is obtained after the lapping procedure, the photoresist process can be implemented without a separate support substrate.

As shown in FIG. 2(c), the metal bonding layer 39 is deposited on the semiconductor laser array 30 with the photoresist pattern M formed thereon and then the photoresist pattern M can be removed by a lift-off process to obtain a desired pattern of the metal bonding layer 39. The metal bonding layer 39 can be made of one selected from the group consisting of In, Pb, Sn, Au, Ag and alloys thereof. For example, the metal bonding layer 39 can be a typical solder material made of Au—Sn, Sn, In, Au—Ag or Pb—Sn. As in this embodiment, in order to more effectively radiate heat through the base to be bonded in a subsequent process, it is preferable that the metal bonding layer 39 is formed on the second electrode 38 which is closer to the active region than the first electrode 37.

The semiconductor laser array with the metal bonding layer formed thereon as shown in FIG. 2(c), is diced into the bar-shaped individual chip units. Then, each unit semiconductor laser array is mounted on the base by the metal bonding process shown in FIGS. 3a and 3b.

Figure 3:
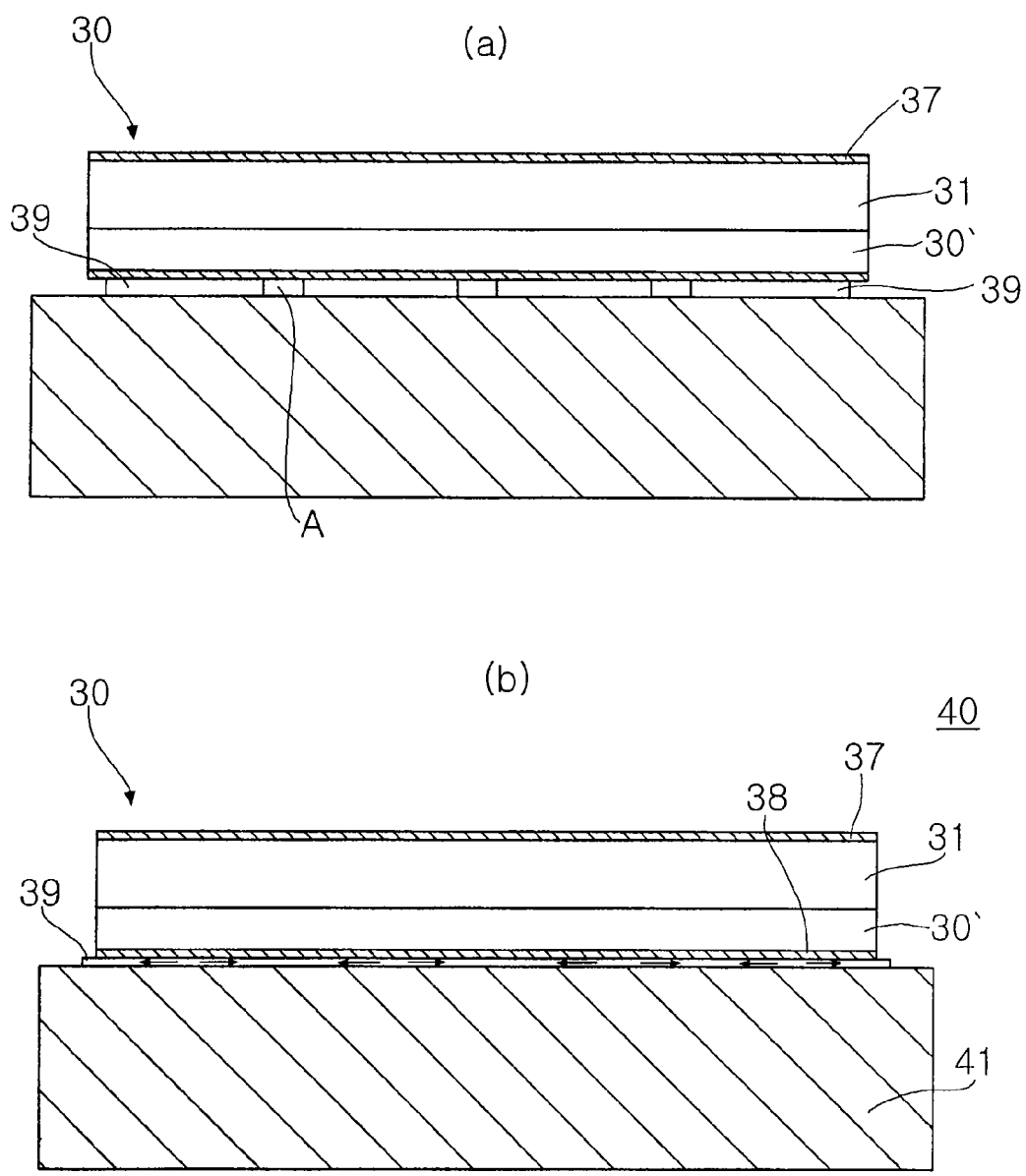
FIG. 3(a) and 3(b) are sectional views illustrating the bonding procedures in the process of manufacturing the array type laser device according to the present invention.

As shown in FIG. 3(a), the semiconductor laser array is mounted on the base 41 with the surface of the metal bonding layer 37 as the bonding surface. As explained above, the metal bonding layer 39 is formed on the second electrode 38 which is closer to the active region than the first electrode 37 and the semiconductor laser array 30 is mounted with a semiconductor stack structure 30', in particular, with the active layer thereof facing the base 41. The base 41 can be a ceramic substrate or a metal substrate with excellent heat radiation characteristics. Of course, if an insulation ceramic substrate is adopted for the base 41, it can be electrically connected to the second electrode of the semiconductor laser array by a separate wire structure.

In the present invention, the metal bonding layer 39 can be formed in a pattern shape through a precise photoresist process, thereby preventing potential short circuit of the laser by the metal bonding layer 39. This will be explained in detail with reference to FIG. 3b.

As shown in FIG. 3b, the metal bonding layer 39 is melted to fix the semiconductor laser array 30 on the base 41. When the metal bonding layer 39 such as solder is melted, the melted metal bonding layer 39 is pressed by the semiconductor laser array 30 and spread in sideward directions (denoted by arrows), but the melted metal bonding layer 30 is prevented, by the buffer region A (FIG. 3a) secured beforehand, from overflowing to the side surface of the laser 30. This solves the problem of short circuit leading to a chip defect, caused by the melted metal bonding material being spread along the edges of the semiconductor laser array 30.

Therefore, according to the present invention, the patterning process of the metal bonding layer is implemented together with a series of semiconductor processes including the photoresist process for fabricating the semiconductor laser array, thereby allowing a more efficient manufacturing process of the semiconductor laser device.

As set forth above, according to the present invention, a metal bonding layer is formed before a semiconductor laser array is diced into individual units at wafer-level, significantly improving efficiency in the manufacturing process and in particular, efficiency in a metal bonding process. Furthermore, a photoresist process is continuously implemented together with a series of semiconductor processes to form the metal bonding layer in a pattern with a buffer region, thereby effectively preventing short circuit due to the metal bonding layer melted during the bonding process.

While the present invention has been shown and described in connection with the exemplary embodiments, it will be apparent to those skilled in the art that modifications and variations can be made without departing from the spirit and scope of the invention as defined by the appended claims.

What is claimed is:

1. A method of manufacturing a high power array type semiconductor laser device, comprising:
    forming first and second electrodes on lower and upper surfaces of a wafer comprising a plurality of semiconductor laser arrays having a plurality of laser emission regions;
    forming a metal bonding layer on a surface of the second electrode of the wafer, the metal bonding layer having open regions, such that the second electrode is partially exposed, wherein the bonding layer has a plurality of separated regions, which are spaced apart from edges of an upper surface of the second electrode and are spaced apart from each other to form void regions;
    dicing the wafer into the semiconductor laser arrays having the metal bonding layer;
    after forming a metal bonding layer, having open regions, on the surface of the second electrode of the wafer, mounting each of the individually separated semiconductor laser arrays on a base with a surface of the metal bonding layer in contact with the base, wherein the metal bonding layer partially exposes the second electrode via the plurality of separated regions; and
    melting the metal bonding layer to fix the mounted semiconductor laser array on the base, wherein the melted metal bonding layer is pressed by the semiconductor laser array and spread in a sideward direction into the void regions, such that at least parts of the separated regions of the metal bonding layer are directly in contact with each other in the void regions.

2. The method according to claim 1, wherein the step of forming the first and second electrodes comprises:
    depositing the first and second electrodes on lower and upper surfaces of the wafer, respectively; and
    heat-treating the deposited first and second electrodes.

3. The method according to claim 1, wherein the second electrode is closer to an active region of the laser than the first electrode.

4. The method according to claim 1, wherein the step of forming the metal bonding layer comprises:
    forming a photoresist pattern having open regions, which are spaced apart from edges of the upper surface of the second electrode and are spaced apart from each other;
    depositing a metal bonding layer in the photoresist pattern; and
    removing the photoresist pattern by a lift-off process to form the metal bonding layer having open regions, which are spaced apart from the edges of the upper surface of the second electrode and spaced apart from each other.

5. The method according to claim 4, wherein the photoresist pattern is formed with a plurality of the open regions spaced apart.

6. The method according to claim 1, wherein the metal bonding layer is made of one selected from the group consisting of In, Pb, Sn, Au, Ag and alloys thereof.

7. The method according to claim 1, wherein the base comprises a ceramic substrate or a metal substrate.

8. The method according to claim 1, wherein the metal bonding layer partially exposes the second electrode through the void regions between the plurality of separated regions.

* * * * *